United States Patent
Suzuki

(10) Patent No.: US 8,377,830 B2
(45) Date of Patent: Feb. 19, 2013

(54) METHOD OF MANUFACTURING A SEMICONDUCTOR DEVICE AND WET PROCESSING APPARATUS

(75) Inventor: Tatsuya Suzuki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 577 days.

(21) Appl. No.: 11/708,128

(22) Filed: Feb. 20, 2007

(65) Prior Publication Data

US 2007/0204956 A1 Sep. 6, 2007

(30) Foreign Application Priority Data

Feb. 23, 2006 (JP) ................. 2006-046752

(51) Int. Cl.
*H01L 21/302* (2006.01)
(52) U.S. Cl. .. 438/745; 438/749; 438/754; 257/E21.485
(58) Field of Classification Search ............ 438/745, 438/749, 754; 257/E21.485
See application file for complete search history.

(56) References Cited

U.S. PATENT DOCUMENTS

| | | | |
|---|---|---|---|
| 2004/0082130 A1* | 4/2004 | Suzuki et al. | 438/275 |
| 2005/0133737 A1* | 6/2005 | Keum et al. | 250/492.21 |
| 2007/0093072 A1* | 4/2007 | Fukuda et al. | 438/758 |
| 2007/0111519 A1* | 5/2007 | Lubomirsky et al. | 438/678 |

FOREIGN PATENT DOCUMENTS

| | | |
|---|---|---|
| JP | 10-79371 | 3/1998 |
| JP | 10-79371(A) | 3/1998 |
| JP | 2001-007019 | 1/2001 |
| JP | 2001-326172 | 11/2001 |
| JP | 2001-358109 | 12/2001 |
| JP | 2003-188138 | 7/2003 |
| JP | 2003-188138(A) | 7/2003 |
| JP | 2005-276095(A) | 10/2005 |
| JP | 2005-307311 | 11/2005 |
| JP | 2007-088262 | 4/2007 |
| WO | WO 2005/057640 | * 5/2005 |

OTHER PUBLICATIONS

Machine Translation of JP-2001-358109.*
Machine Translation of JP-2003-188138.*
Notification of Reason(s) for Refusal dated Feb. 22, 2011.
Notification of Reason(s) for Refusal dated Sep. 13, 2011 with an English language translation thereof.
Chinese Office Action dated Nov. 15, 2011.

* cited by examiner

*Primary Examiner* — Julia Slutsker
(74) *Attorney, Agent, or Firm* — McGinn IP Law Group, PLLC

(57) ABSTRACT

An electrically conductive first chemical solution is supplied to the back surface of a semiconductor substrate, on the front surface of which elements are formed. After starting supplying the first chemical solution, wet processing is performed by supplying an electrically conductive second chemical solution to the front surface of the semiconductor substrate.

22 Claims, 11 Drawing Sheets

METHOD OF MANUFACTURING A SEMICONDUCTOR DEVICE AND WET PROCESSING APPARATUS

This application is based on Japanese Patent application NO. 2006-046752, the content of which is incorporated hereinto by reference.

BACKGROUND

1. Technical Field

The present invention relates to a method of manufacturing a semiconductor device and to a wet processing apparatus.

2. Related Art

For integrating two kinds of transistors having different power source voltages (Vdd) into one chip, gate insulating films having different film thicknesses need to be formed on one and the same silicon substrate. Such a gate insulating film is formed by what is known as the multiple oxide technique. Hereafter, the procedure therefor will be described. First, a silicon oxide film having a large film thickness is formed on two transistor formation regions. Thereafter, the transistor formation region for forming a transistor (I/O or the like) having a high Vdd is covered with a resist, and the silicon oxide film formed on the transistor formation region for forming a transistor (core transistor) having a low Vdd is removed by etching with use of BHF or the like. Subsequently, the resist is removed, and a silicon oxide film having a small film thickness is formed on the transistor formation region for forming the low-Vdd transistor. This completes forming gate insulating films having different film thicknesses.

In recent years, in accordance with the miniaturization of devices, high uniformity and reduction of foreign substances are demanded in removing silicon oxide films by etching. For this reason, a technique for removing the silicon oxide film with use of the sheet-by-sheet method is now adopted. In the sheet-by-sheet method, a chemical solution ejecting nozzle is directed, for example, towards the center on the front surface of a substrate which is held and rotated at a predetermined rotation number, and a chemical solution such as BHF is ejected from the nozzle. This removes the silicon oxide film on the front surface of the substrate by etching.

Japanese Laid-open patent publication No. 10-79371 discloses a wet etching processing method of etching the front surface of a substrate by spraying an etchant onto the front surface, wherein the etchant is sprayed onto the back surface of the substrate as well simultaneously with the front surface. By this, the etchant is sprayed onto the back surface of the substrate simultaneously with the front surface, so that a liquid flow is generated on the back surface, thereby preventing circulation of the etchant to the back surface of the substrate with help of this liquid flow. For this reason, it is said that particles contained in the etchant flowing from the front surface of the substrate will hardly adhere to the surface of the substrate. Also, since the front surface and the back surface of the substrate are processed with use of the same etchant, the zeta electric potential generated on the front surface and on the back surface will be the same electric potential, so that the adhesion of the particles onto the back surface because of the electric potential difference can be prevented.

In the meantime, in removing the oxide film by etching with use of the sheet-by-sheet method, there arises a problem in that defects such as digging or melting of diffusion layers in the front surface of the substrate occur, thereby leading to decrease in the yield.

The present inventors have made eager studies on the cause of the generation of such defects. As a result, the inventors have found out that this is because of the following reason. At the time of removing the oxide film by etching, the substrate is electrically charged and, when a BHF chemical solution is brought into contact with a specific site (for example, the center) on the substrate, the electric charge accumulated in the substrate escapes all at once to the electrically conductive chemical agent side.

FIG. 10 shows a state in which BHF, which is an electrically conductive chemical solution, is supplied to the front surface of an electrically charged semiconductor substrate 1000, found by the present inventors. In a wet processing apparatus of sheet-by-sheet system, when the semiconductor substrate 1000 is mounted on a mounting base constructed, for example, with Teflon (registered trade mark) or the like, the back surface of the semiconductor substrate 1000 will be positively charged and, in accordance therewith, the front surface of the semiconductor substrate 1000 will be negatively charged. When an electrically conductive chemical solution is supplied to the front surface of the semiconductor substrate 1000 in a state in which the semiconductor substrate 1000 is electrically charged in this manner, the static electricity escapes from the front surface of the semiconductor device 1000 into the electrically conductive chemical solution to form an electric current path, whereby damage is generated on the front surface of the semiconductor substrate 1000.

Japanese Laid-open patent publication No. 2005-307311 discloses a substrate processing apparatus having a static electricity regulating unit and a wet-type processing apparatus. The static electricity regulating unit has a static electricity sensor that detects the electrically charged state of a substrate and a charged part blower, thereby to remove the static electricity that is present in the electrically charged substrate or to charge the substrate to an arbitrary electrically charged state. By this, it is held that, by suitably controlling the electrically charged state of the substrate in accordance with the kind of a wet-type process, deficiency caused by the static electricity on the front surface of the substrate can be restrained. However, with this construction, there is a need to provide a charged part blower, so that the apparatus construction will be large and complex.

Japanese Laid-open patent publication No. 2003-188138 discloses a step in which, in order to restrain the charging of the substrate to be processed, an electrically charged fluid for removing electricity whose charged amount can be controlled is supplied to a semiconductor wafer during the cleaning processing step, whereby the electric charge that is present on the front surface side of the semiconductor wafer is removed in the cleaning processing step. Japanese Laid-open patent publication No. 2003-188138 gives a description that pure water for removing electricity may be supplied to the back surface of the wafer before pure water for cleaning is jetted onto the front surface of the water.

FIG. 11 is a schematic view illustrating the conventional art disclosed in Japanese Laid-open patent publication No. 2003-188138. It is disclosed that when negatively charged pure water is allowed to act on a semiconductor substrate 1000 having a negatively charged front surface and a positively charged back surface, the positive charge on the back surface of the semiconductor substrate 1000 is neutralized, whereby the charged amount of the semiconductor substrate 1000 can be reduced. However, with such a method, it is difficult to control the timing for reducing the charged amount of the semiconductor substrate 1000 approximately to zero. Also, when the period of time for supplying the negatively charged pure water becomes long, there is a fear that the back surface side of the semiconductor substrate 1000 will be negatively charged, and the front surface will be positively charged.

When the semiconductor substrate 1000 remains in an electrically charged state and an electrically conductive chemical solution is allowed to act on the front surface of the semiconductor substrate 1000, the electrically conductive chemical solution will be an electric current path, and it is not possible to prevent the damage from being generated onto the front surface of the semiconductor substrate 1000, in the same manner as shown in FIG. 10.

Also, even if the etchant is sprayed onto the back surface of the semiconductor substrate simultaneously with the front surface as disclosed in Japanese Laid-open patent publication No. 10-79371, it is not possible to prevent the damage from being generated onto the front surface of the semiconductor substrate.

SUMMARY OF THE INVENTION

According to the present invention, there is provided a method of manufacturing a semiconductor device, including:

supplying an electrically conductive first chemical solution to a back surface of a semiconductor substrate, on a front surface of which elements are formed; and after starting the supplying the first chemical solution to the back surface of the semiconductor device, performing wet processing by supplying an electrically conductive second chemical solution to the front surface of the semiconductor substrate.

Here, the electrically conductive chemical solution may be, for example, BHF (Buffered Hydrofluoric Acid), DHF (Diluted Hydrofluoric Acid), SPM (Sulfuric Acid/Hydrogen Peroxide (/Water) Mixture), APM (Ammonium Hydroxide/Hydrogen Peroxide (/Water) Mixture), or HPM (Hydrochloride/Hydrogen Peroxide (/Water) Mixture). The electrically conductive chemical solution may be a solution containing an electrolyte. The period of time from starting the step of supplying the first chemical solution until starting the step of performing the wet processing may be determined in accordance with the contents of the wet processing and the characteristics of the wet processing apparatus, and may be a period of time that is sufficient for the charged amount of the semiconductor substrate to become less than or equal to a predetermined value. This period of time may be, for example, several seconds to several ten seconds.

By doing in this manner, the electric charge can be removed from the back surface of the semiconductor substrate before supplying the electrically conductive chemical solution to the front surface of the semiconductor substrate in performing the wet processing on the front surface of the semiconductor substrate, so that occurrence of defects such as digging or melting of diffusion layers in the front surface of the semiconductor substrate can be prevented. According to the present invention, the electric charge in the semiconductor substrate can be removed by a simple method while restraining the increase in the costs of the apparatus.

According to the present invention, there is provided a wet processing apparatus including:

a mounting base on which a semiconductor substrate is mounted;

a first chemical solution nozzle which supplies an electrically conductive chemical solution to a front surface of the semiconductor substrate mounted on the mounting base;

a second chemical solution nozzle which supplies an electrically conductive chemical solution to a back surface of the semiconductor substrate mounted on the mounting base; and a controlling unit which controls a timing for supplying the chemical solution from the first chemical solution nozzle and a timing for supplying the chemical solution from the second chemical solution nozzle, the controlling unit starts the supplying the chemical solution from the first chemical solution nozzle after the supplying the chemical solution from the second chemical solution nozzle is started.

By doing in this manner, the electric charge can be removed from the back surface of the semiconductor substrate before supplying the electrically conductive chemical solution to the front surface of the semiconductor substrate in performing the wet processing on the front surface of the semiconductor substrate, so that generation of damages on the front surface of the semiconductor substrate can be prevented.

Here, any combination of the above-described constituent elements as well as those obtained by conversion of the representation of the present invention among methods, apparatus, and others are also effective as aspects of the present invention.

According to the present invention, damages onto the front surface of the semiconductor substrate in the wet processing can be reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
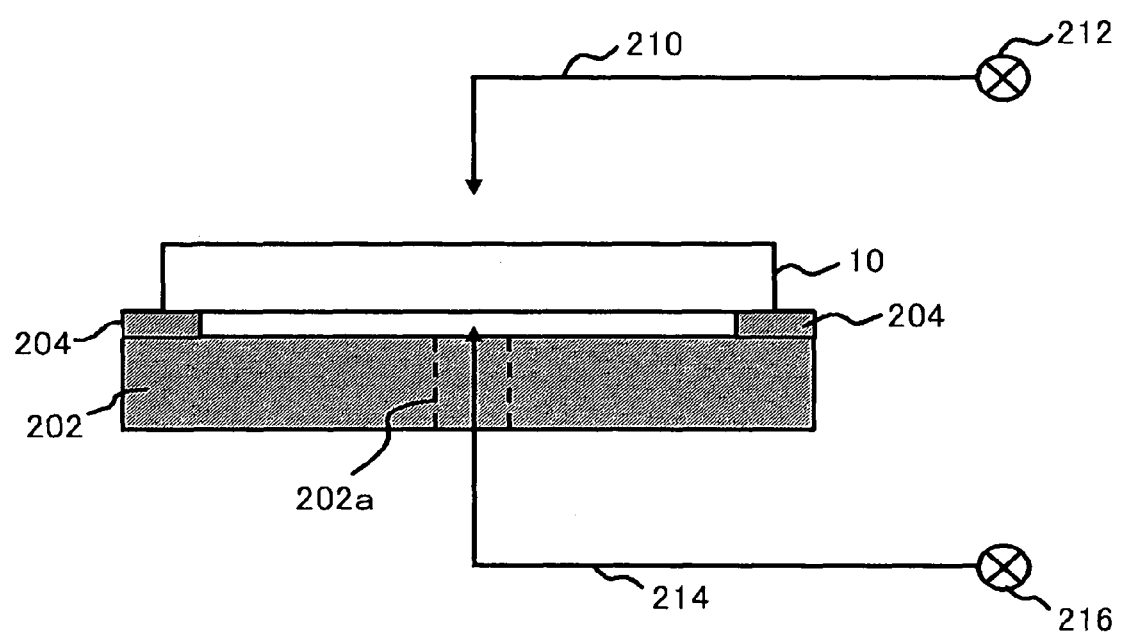
FIG. 1 is a schematic view illustrating a construction of a wet processing apparatus according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereafter, embodiments of the present invention will be described with reference to the attached drawings. Here, in all of the drawings, like constituent elements are denoted with like reference numerals, and the description thereof will not be repeated.

First Embodiment

FIG. 1 is a schematic view illustrating a construction of a wet processing apparatus according to the present embodiment.

A wet processing apparatus 200 includes a mounting base 202, a chuck 204, a first chemical solution nozzle 210, a first valve 212, a second chemical solution nozzle 214, and a second valve 216. A semiconductor substrate 10 is mounted on the mounting base 202. The chuck 204 holds the semiconductor substrate 10. Elements (not shown in the drawings) such as transistors, for example, are halfway formed on the front surface of the semiconductor substrate 10. The first chemical solution nozzle 210 supplies a chemical solution to the front surface of the semiconductor substrate 10. The second chemical solution nozzle 214 supplies a chemical solution to the back surface of the semiconductor substrate 10. By opening the first valve 212, the chemical solution is supplied from the first chemical solution nozzle 210. By opening the second valve 216, the chemical solution is supplied from the second chemical solution nozzle 214. An opening 202a is formed at the center of the mounting base 202, and the tip end of the second chemical solution nozzle 214 is introduced into the opening 202a, so as to supply the chemical solution to the back surface of the semiconductor substrate 10.

In the present embodiment, the mounting base 202 may be made of a fluororesin such as Teflon (registered trademark). The semiconductor substrate 10 is rotatably held by the mounting base 202. Here, the mounting base 202 is negatively charged. When the semiconductor substrate 10 is mounted on the mounting base 202, the back surface of the semiconductor substrate 10 will be positively charged, and the front surface will be negatively charged.

Next, in the present embodiment, description will be given on a procedure for performing a wet processing on the front surface of the semiconductor substrate 10 with use of the wet processing apparatus 200.

Figure 2A:
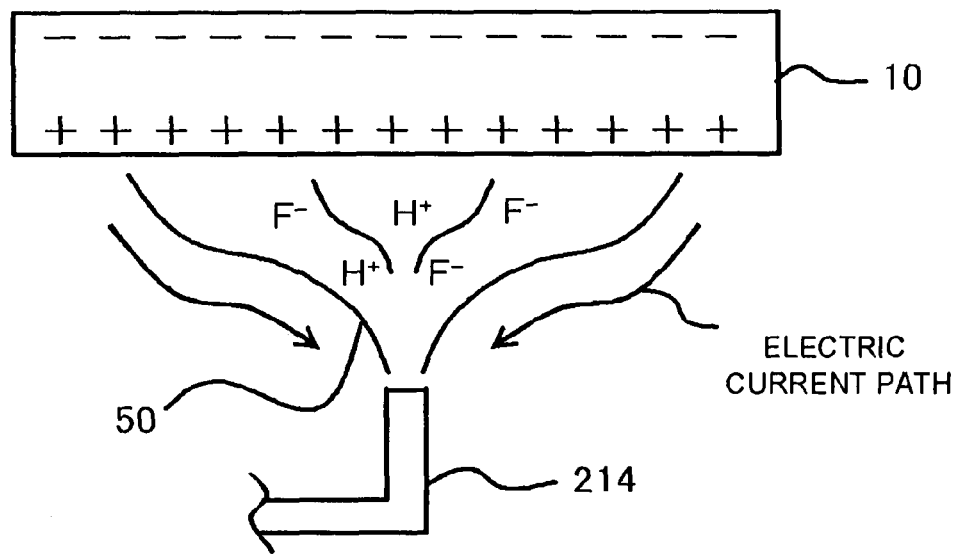
FIGS. 2A and 2B are schematic views illustrating a wet processing procedure according to an embodiment of the present invention.
Figure 2B:
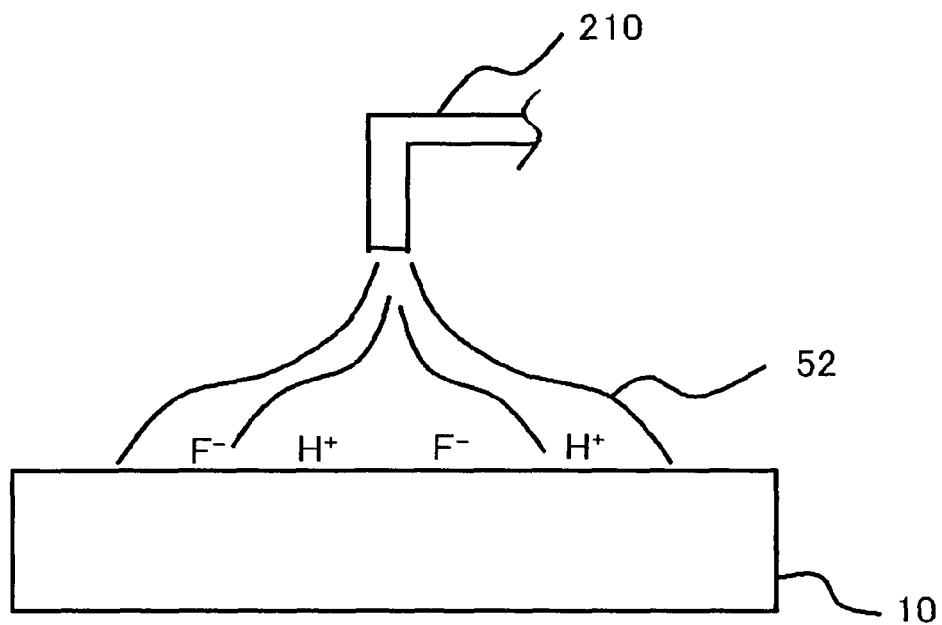

FIGS. 2A and 2B are schematic views illustrating a wet processing procedure according to the present embodiment. First, referring to FIG. 2A, an electrically conductive first chemical solution 50 containing an electrolyte is supplied to the back surface of the semiconductor substrate 10 from the second chemical solution nozzle 214. Here, the first chemical solution 50 may be an electrically conductive chemical solution such as BHF, DHF, SPM, APM, or HPM, for example. By supplying the electrically conductive first chemical solution 50 to the back surface of the semiconductor substrate 10 in this manner, static electricity escapes from the back surface of the semiconductor substrate 10 into the first chemical solution 50 to form an electric current path, whereby electricity in the semiconductor substrate 10 can be removed. The electric conductivity of the first chemical solution 50 may be 1 µS/cm or more in terms of electric conductivity (or 1 MΩ·cm or less in terms of specific resistance), more preferably 5 µS/cm or more in terms of electric conductivity (0.2 MΩ·cm or less in terms of specific resistance).

Subsequently, referring to FIG. 2B, an electrically conductive second chemical solution 52 is supplied to the front surface of the semiconductor substrate 10 from the first chemical solution nozzle 210. By doing in this manner, the second chemical solution 52 can be supplied to the front surface of the semiconductor substrate 10 in a state in which the semiconductor substrate 10 is not electrically charged. This allows that, even if the second chemical solution 52 contains an electrolyte, an electric current path is not formed on the front surface side of the semiconductor substrate 10, whereby damages onto the front surface of the semiconductor substrate 10 can be reduced. The first chemical solution 50 may contain a same material as the second chemical solution 52. In the present embodiment, the first chemical solution 50 and the second chemical solution 52 may be the same chemical solution. FIGS. 2A and 2B show an example in which the first chemical solution 50 and the second chemical solution 52 are BHF. Also, in other examples, the first chemical solution 50 and the second chemical solution 52 may be different chemical solutions. Supply of the second chemical solution 52 may be started after the electricity in the semiconductor substrate 10 is removed. Whether the electricity in the semiconductor substrate 10 has been removed or not can be determined by detecting the electrically charged amount of the semiconductor substrate 10 as follows. It can be deemed that the electricity in the semiconductor substrate 10 has been removed, when the electrically charged amount has become less than or equal to a predetermined criterion value by detecting the electrically charged amount of the semiconductor substrate 10, or when a sufficient period of time that is needed in reducing the electrically charged amount to be less than or equal to a predetermined criterion value has passed.

Figure 3:
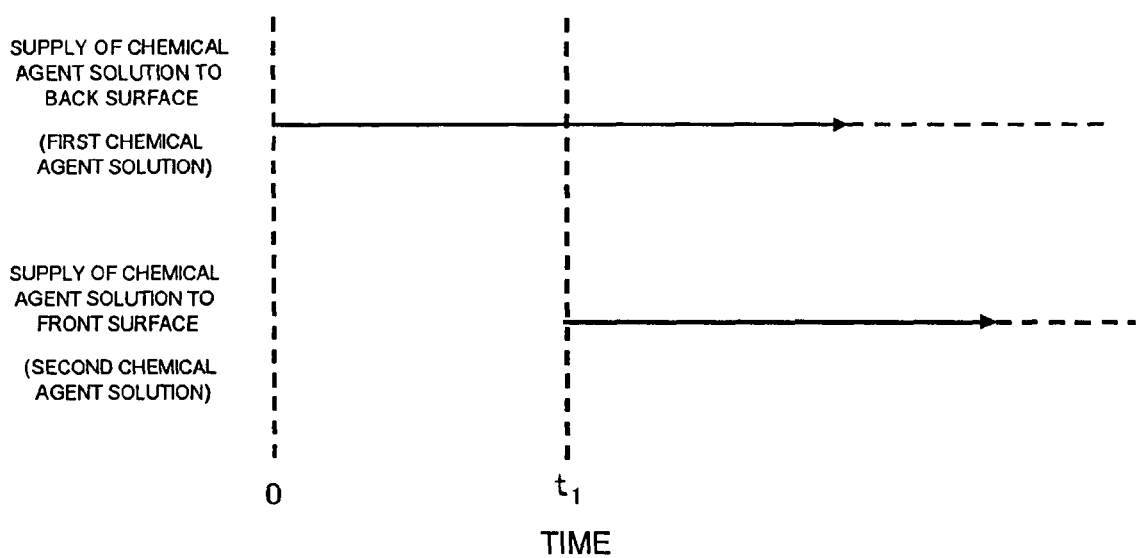
FIG. 3 is a view showing a timing for supplying a first chemical solution and a second chemical solution.

FIG. 3 is a view showing a timing for supplying the first chemical solution 50 and the second chemical solution 52. First, at the time zero, the first chemical solution 50 is supplied to the back surface of the semiconductor substrate 10. Subsequently, after the time $t_1$ passes, the second chemical solution 52 is supplied to the front surface of the semiconductor substrate 10. The time $t_1$ can be determined in accordance with the contents of the wet processing and the characteristics of the wet processing apparatus, and may be a period of time that is sufficient for the charged amount of the semiconductor substrate 10 to become less than or equal to a predetermined value. For example, the time $t_1$ may be determined by the charged amount of the semiconductor substrate 10. Also, the time $t_1$ may be determined in accordance with the kind of the first chemical solution 50. Here, while the second chemical solution 52 is being supplied to the front surface of the semiconductor substrate 10, the first chemical solution 50 may be kept being supplied to the back surface of the semiconductor substrate 10, or alternatively the supply of the first chemical solution 50 may be stopped.

Next, a procedure for manufacturing a semiconductor device in the present embodiment will be described. In the present embodiment, the present invention is applied to the manufacture of gate insulating films having different film thicknesses.

FIGS. 4A to 5B are cross-sectional step views showing a procedure for manufacturing gate insulating films having different film thicknesses in the present embodiment.

Figure 4A:
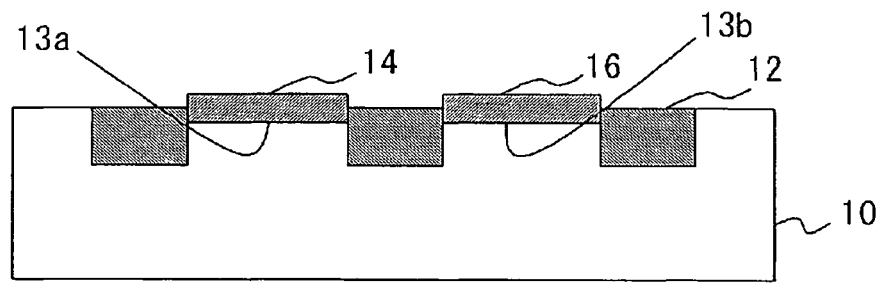
FIGS. 4A to 4D are cross-sectional step views showing a procedure for manufacturing gate insulating films having different film thicknesses in the embodiment of the present invention.
Figure 4B:
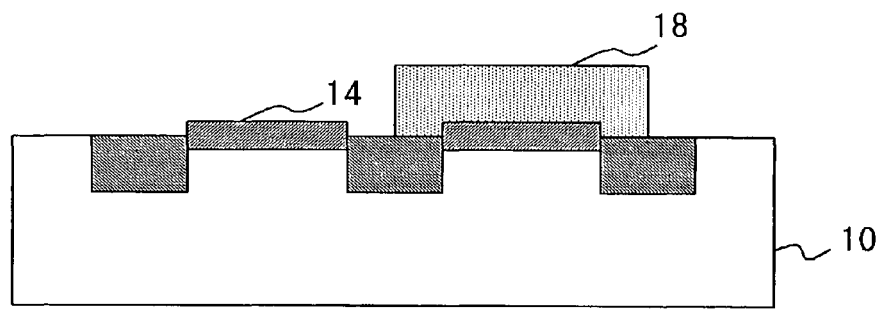

First, after an element isolation region 12 is formed on a semiconductor substrate 10, a first oxide film 14 (for example, having a film thickness of 5.0 nm) and a second oxide film 16 (for example, having a film thickness of 5.0 nm) are formed by the thermal oxidation method in a first region 13a and in a second region 13b, respectively (FIG. 4A) Here, the semiconductor substrate 10 is a silicon substrate, and the first oxide film 14 and the second oxide film 16 are silicon oxide films. The element isolation region 12 is formed by the shallow trench isolation method (STI method), and is made of an oxide film formed by the thermal oxidation method and the CVD method. Subsequently, a resist layer 18 is formed on the second oxide film 16 (FIG. 4B).

Figure 4C:
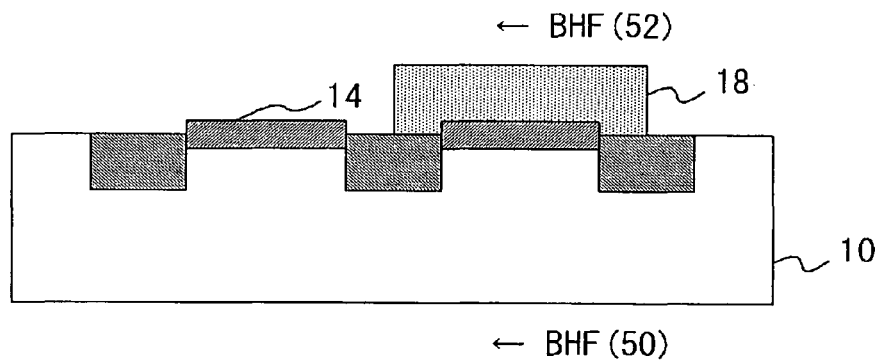
Figure 4D:
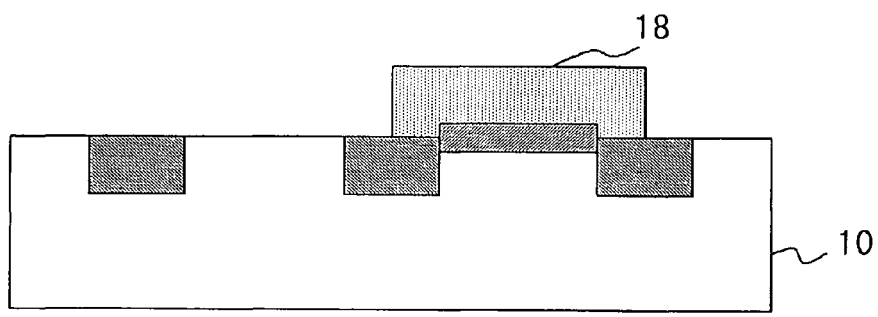

In this state, a process of removing the first oxide film 14 is carried out by the wet processing apparatus 200 shown in FIG. 1 (FIG. 4C). In the wet processing apparatus 200, the first oxide film 14 formed on the front surface of the semiconductor substrate 10 is removed by wet etching with use of buffered hydrofluoric acid (BHF) (second chemical solution 52). In the present embodiment, BHF (first chemical solution 50) is supplied to the back surface of the semiconductor substrate 10 before starting the wet processing onto the front surface of the semiconductor substrate 10 with use of the second chemical solution 52. This allows that the wet processing can be carried out on the front surface of the semiconductor substrate 10 in a state in which the semiconductor substrate 10 is not electrically charged, whereby the front surface of the semiconductor substrate 10 can be prevented from receiving damages. By this process, the first oxide film 14 is removed (FIG. 4D).

Figure 5A:
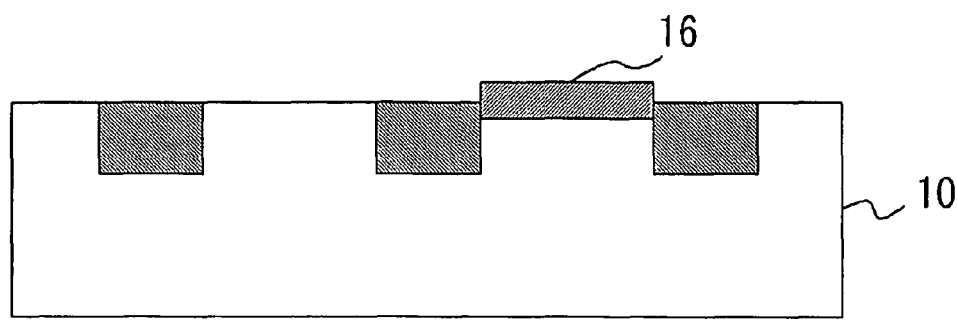
FIGS. 5A and 5B are cross-sectional step views showing a procedure for manufacturing gate insulating films having different film thicknesses in the embodiment of the present invention.

Thereafter, the resist layer 18 is removed by wet etching. Here, the wet etching of the resist layer 18 may be carried out either by the immersion method or by the sheet-by-sheet method. This completes removal of the resist layer 18 (FIG. 5A).

Figure 5B:
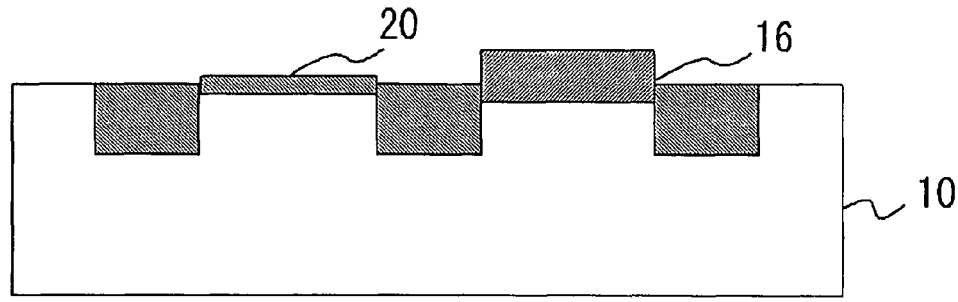

Subsequently, a third oxide film 20 (for example, having a film thickness of 0.8 nm) is formed by RTO (rapid thermal oxidation) (FIG. 5B). This forms two gate insulating films having different film thicknesses. Thereafter, a gate electrode is formed on the gate insulating film, and source/drain regions are formed, whereby transistors with gate insulating films having different thicknesses can be formed.

Second Embodiment

Figure 6:
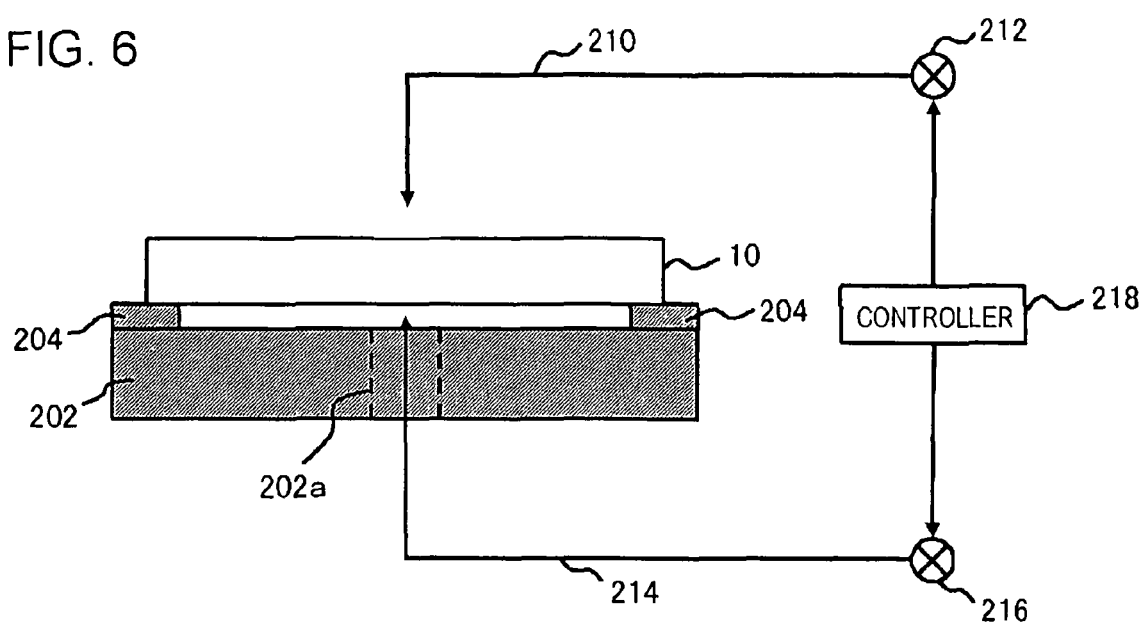
FIG. 6 is a view illustrating a construction of a wet processing apparatus according to an embodiment of the present invention.

FIG. 6 is a view illustrating a construction of a wet processing apparatus 200 according to the present embodiment.

In the present embodiment, the wet processing apparatus 200 further includes a controller (controlling unit) 218 in addition to the construction described with reference to FIG. 1 in the first embodiment. The controller 218 controls opening and closing of the first valve 212 and the second valve 216. In the present embodiment, the controller 218 performs the process of supplying a chemical solution from the second chemical solution nozzle 214 by opening the second valve 216 prior to the process of supplying a chemical solution from the first chemical solution nozzle 210 by opening the first valve 212. This allows that, in performing the wet processing on the front surface of the semiconductor substrate 10, electric charge can be removed from the back surface of the semiconductor substrate 10 before an electrically conductive chemical solution is supplied to the front surface of the semiconductor substrate 10, whereby generation of damages on the front surface of the semiconductor substrate 10 can be prevented.

Figure 7:
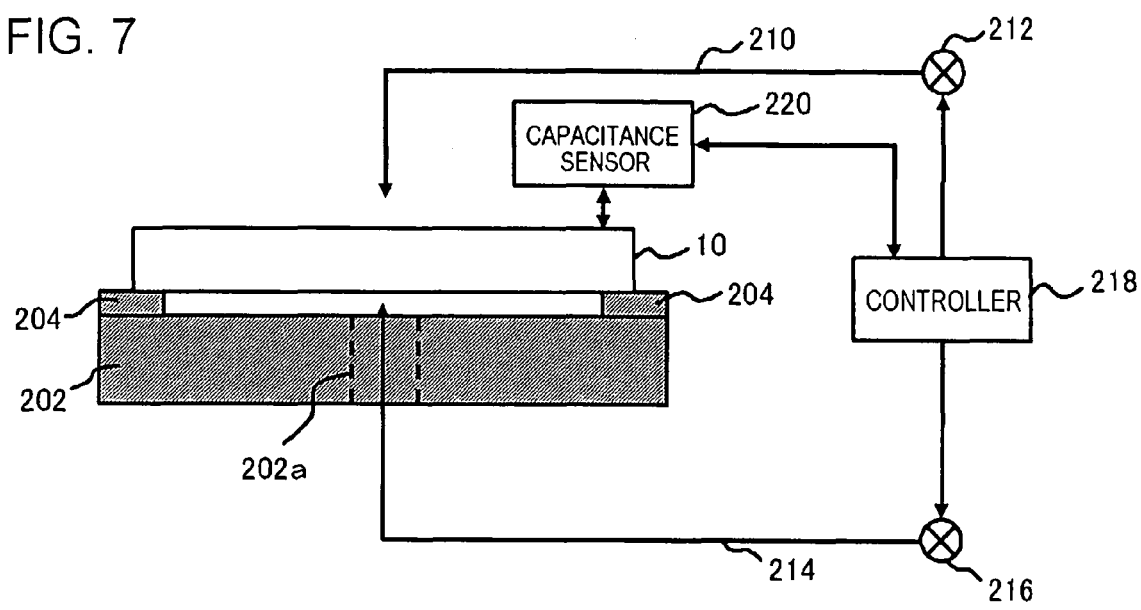
FIG. 7 is a view illustrating a construction of a wet processing apparatus according to an embodiment of the present invention.

FIG. 7 is a view illustrating another example of a wet processing apparatus 200 according to the present embodiment.

The wet processing apparatus 200 may further include a capacitance sensor 220 in addition to the construction described with reference to FIG. 6. The capacitance sensor 220 may be an apparatus that measures the electrically charged amount of the semiconductor substrate 10 in a state of non-contact, i.e. without touching the semiconductor substrate 10. The capacitance sensor 220 informs the controller 218 of the measured charged amount. After starting the process of supplying a chemical solution from the second chemical solution nozzle 214 by opening the second valve 216, the controller 218 detects the timing at which the charged amount of the semiconductor substrate 10 measured by the capacitance sensor 220 has become lower than or equal to a predetermined criterion value. The controller 218 may include a memory that stores the predetermined criterion value. When the charged amount of the semiconductor substrate 10 has become lower than or equal to the predetermined criterion value, the controller 218 starts the process of supplying a chemical solution from the first chemical solution nozzle 210 by opening the first valve 212.

By adopting such a construction, the wet processing on the front surface of the semiconductor substrate 10 can be started at an appropriate timing. Here, FIG. 7 shows a construction in which the controller 218 controls the opening and closing of the first valve 212 and the second valve 216. However, when the controller 218 detects the timing at which the charged amount of the semiconductor substrate 10 has become lower than or equal to the predetermined criterion value, the controller 218 may inform the user of the timing with use of an informing unit or the like (not shown in the drawings). This allows that the user of the wet processing apparatus 200 can start the wet processing on the front surface of the semiconductor substrate 10 by opening the first valve 212 at an appropriate timing.

Figure 8:
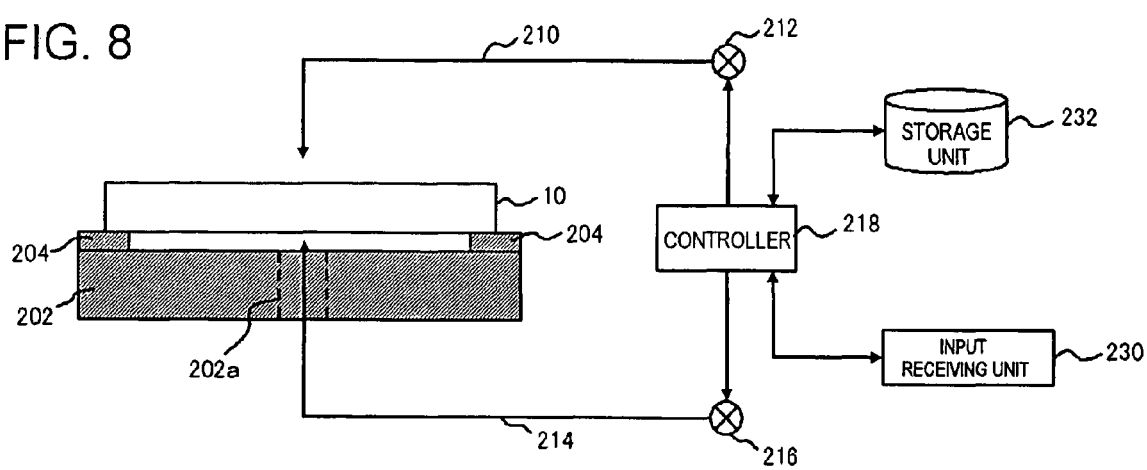
FIG. 8 is a view illustrating a construction of a wet processing apparatus according to an embodiment of the present invention.
Figure 9:
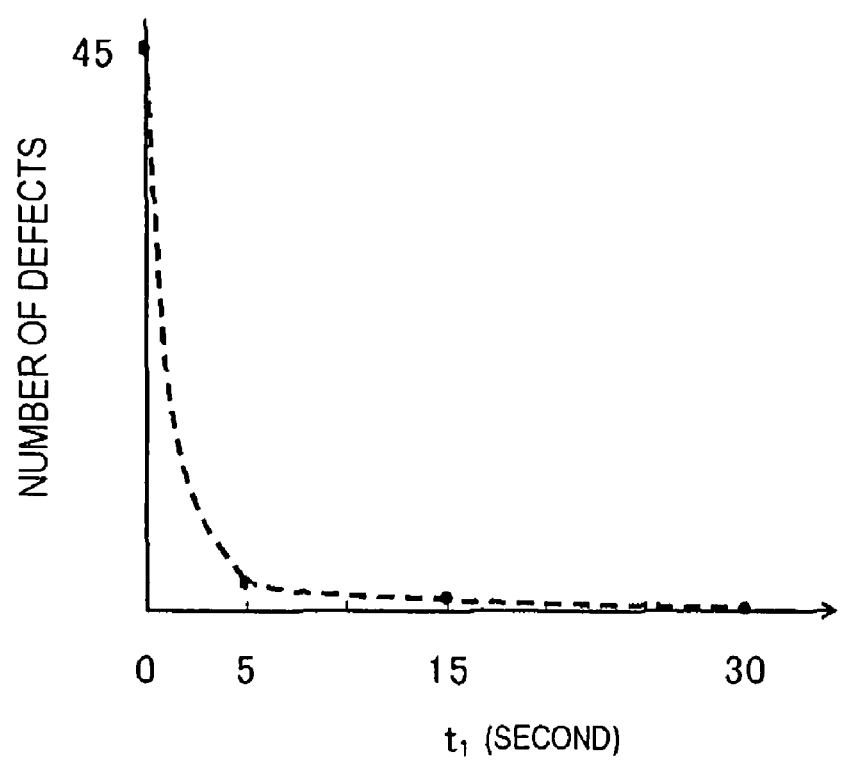
FIG. 9 is a view showing a relationship between the time for supplying an electrically conductive chemical solution to the back surface of a semiconductor substrate before performing wet processing on the front surface of the semiconductor substrate and the number of defects.
Figure 10:
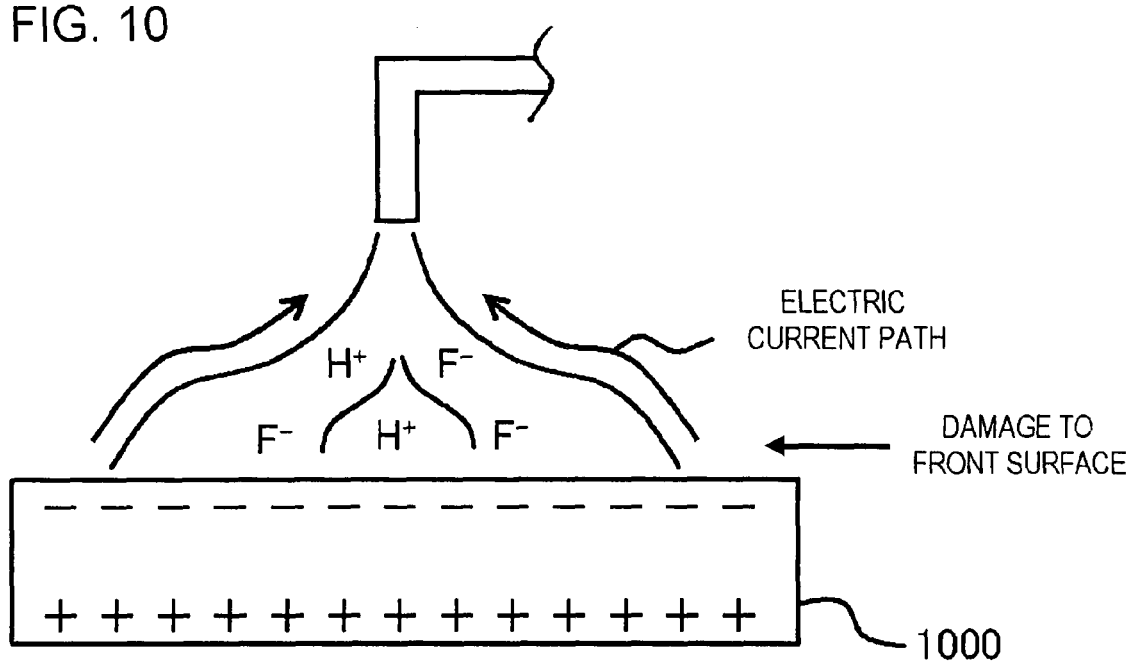
FIG. 10 is a view showing a state in which BHF, which is an electrically conductive chemical solution, is supplied to the electrically charged front surface of the semiconductor substrate.
Figure 11:
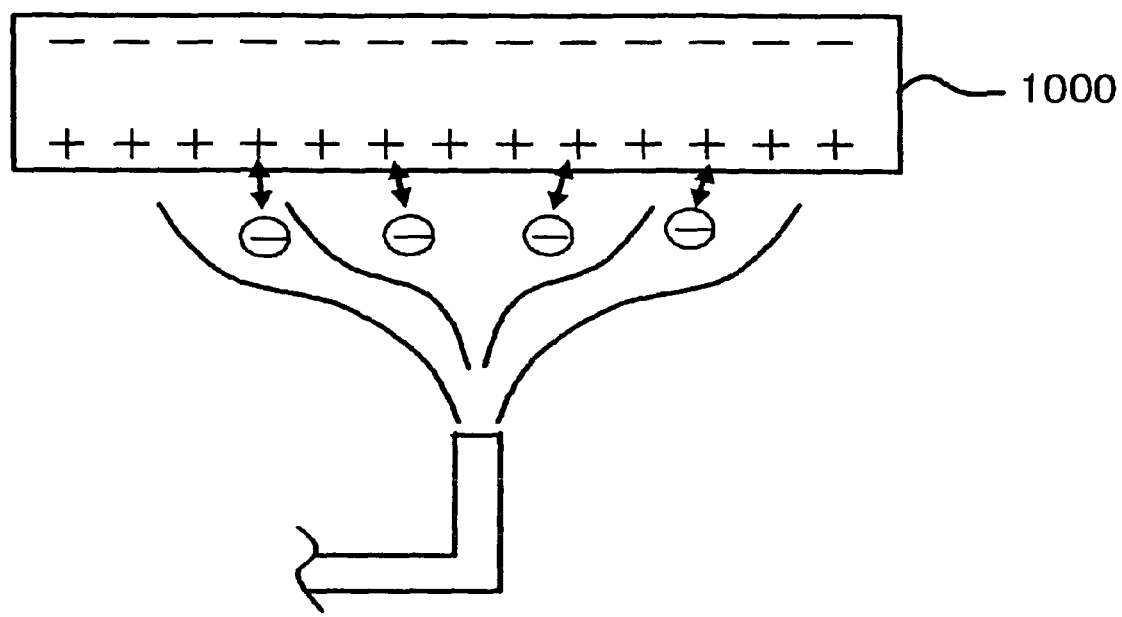
FIG. 11 is a schematic view illustrating a conventional art.

FIG. 8 is a view illustrating another example of a wet processing apparatus 200 according to the present embodiment.

The wet processing apparatus 200 may have a construction of further including an input receiving unit 230 and a storing unit 232. The storing unit 232 may store, for example, the process of each stage in the process of manufacturing a semiconductor device and the processing time needed for removing the electric charge of the semiconductor substrate 10 in that process in correspondence. Here, the needed processing time refers to the period of time needed for the charged amount of the semiconductor substrate 10 to become lower than or equal to a predetermined value after starting to supply the first chemical solution 50 onto the back surface of the semiconductor substrate 10. When the input receiving unit 230 accepts the contents of processing, the controller 218 makes reference to the storing unit 232 to obtain the processing time that is stored in correspondence with the relevant process. Subsequently, the controller 218 opens the second valve 216 to start supplying an electrically conductive chemical solution to the back surface of the semiconductor substrate 10 and, when the obtained processing time passes, the controller 218 opens the first valve 212 to start supplying a chemical solution to the front surface of the semiconductor substrate 10.

Here, the controller 218 and the storing unit 232 of the wet processing apparatus 200 shown in FIGS. 6 to 8 show not a construction in hardware units but blocks in functional units. These are realized by an arbitrary combination of hardware and software principally including a CPU and a memory of an arbitrary computer, a program stored in the memory, storing units that store the program, and others.

Example

A semiconductor device was manufactured in accordance with the procedure described with reference to FIGS. 4A to 5B. During this, in the process of removing the first oxide film 14 in FIG. 4C, the period of time $t_1$ from starting to supply the first chemical solution 50 to the back surface of the semiconductor substrate 10 until starting to supply the second chemical solution 52 to the front surface of the semiconductor substrate 10 was set to be 0 second, 5 seconds, 15 seconds, and 30 seconds. The first chemical solution 50 and the second chemical solution 52 were both BHF, and the flow rate was set to be about 2 L/min. Under such a condition, the number of defects (number of suffering from the defects) in the diffusion layers of the front surface of the semiconductor substrate 10 was observed. When $t_1$ was 0 second, the number of defects was 45, whereas when $t_1$ was set to be 5 seconds, the number of defects was 2, showing a considerable decrease. Also, when $t_1$ was set to be 30 seconds, no defects were seen. Also, though the charged amount of the semiconductor substrate 10 before starting to supply the first chemical solution 50 was about −5 to −6 KV, the charged amount became about 0.1 KV when $t_1$ was set to be 30 seconds.

In this manner, the charged amount such that no defects are generated or the number of defects is lower than or equal to a predetermined value with regard to the elements formed on the front surface of the semiconductor substrate 10 may be measured, and $t_1$ may be determined in accordance therewith. Also, $t_1$ may be determined by the period of time such that no defects are generated or the number of defects is lower than or equal to a predetermined value with regard to the elements formed on the front surface of the semiconductor substrate 10.

As shown above, the embodiments of the present invention were described with reference to the drawings; however, these are merely examples of the present invention, so that various constructions can be adopted other than the above-described one.

In the above-described embodiments, the step of removing the oxide film formed on the front surface of the semiconductor substrate 10 has been described as an example. However, the present invention can be applied, for example, to a step of forming a multiple-layer interconnect structure formed on a semiconductor substrate. For example, in a multiple-layer interconnect structure, the present invention can be applied to the rinsing step after a copper interconnect is formed.

It is apparent that the present invention is not limited to the above embodiment, that may be modified and changed without departing from the scope and spirit of the invention.

What is claimed is:

1. A method of manufacturing a semiconductor device, comprising:
    supplying an electrically conductive first chemical solution to a back surface of a semiconductor substrate, on a front surface of which elements are formed; and
    after starting said supplying said first chemical solution to said back surface of said semiconductor substrate, performing wet etching by supplying an electrically conductive second chemical solution to said front surface of said semiconductor substrate,
    wherein said performing the wet etching is started after an electrical charge of said semiconductor substrate is reduced,
    wherein said electrically conductive second chemical solution is started to be supplied to said front surface of said semiconductor substrate while said electrically conductive first chemical solution is continued to be supplied to said back surface of said semiconductor device, and
    wherein the first chemical solution comprises an electrical conductivity of 1 μS/cm or more.

2. The method of manufacturing a semiconductor device according to claim 1, wherein said first chemical solution and said second chemical solution comprise a same material.

3. The method of manufacturing a semiconductor device according to claim 1, wherein in said performing the wet etching, an oxide film formed on said front surface of said semiconductor substrate is removed by said second chemical solution.

4. The method of manufacturing a semiconductor device according to claim 2, wherein in said performing the wet etching, an oxide film formed on said front surface of said semiconductor substrate is removed by said second chemical solution.

5. The method of manufacturing a semiconductor device according to claim 1, further comprising detecting an electrically charged amount of said semiconductor substrate after starting said supplying the first chemical solution to said back surface of said semiconductor device,
    wherein said performing the wet etching is started after it is detected that the electrically charged amount of said semiconductor substrate has become lower than or equal to a predetermined criterion value in said detecting the electrically charged amount of the semiconductor substrate.

6. The method of manufacturing a semiconductor device according to claim 3, further comprising detecting an electrically charged amount of said semiconductor substrate after starting said supplying the first chemical solution to said back surface of said semiconductor device,
    wherein said performing the wet etching is started after it is detected that the electrically charged amount of said semiconductor substrate has become lower than or equal to a predetermined criterion value in said detecting the electrically charged amount of the semiconductor substrate.

7. The method of manufacturing a semiconductor device according to claim 1, wherein said performing the wet etching is started after the electrical charge of said semiconductor substrate is removed.

8. The method of manufacturing a semiconductor device according to claim 5, wherein said performing the wet etching is started after it is detected that the electrical charge of said semiconductor substrate is removed in said detecting the electrically charged amount of the semiconductor substrate.

9. The method of manufacturing a semiconductor device according to claim 1, wherein said performing the wet etching is started after a period of time that is needed in reducing an electrically charged amount of said semiconductor substrate to such an amount that defects will not be generated in the elements formed on said front surface when said second chemical solution is supplied to said front surface has passed.

10. The method of manufacturing a semiconductor device according to claim 3, wherein said performing the wet etching is started after a period of time that is needed in reducing an electrically charged amount of said semiconductor substrate to such an amount that defects will not be generated in the elements formed on said front surface when said second chemical solution is supplied to said front surface has passed.

11. A method of wet processing, comprising:
    supplying an electrically conductive first chemical solution to a back surface of a semiconductor substrate; and
    after starting said supplying said first chemical solution to said back surface of said semiconductor substrate, performing wet etching by supplying an electrically conductive second chemical solution to a front surface of said semiconductor substrate,
    wherein elements are disposed the front surface of the semiconductor substrate,
    wherein said performing the wet etching is started after an electrical charge of said semiconductor substrate is reduced, wherein said electrically conductive second chemical solution is started to be supplied to said front surface of said semiconductor substrate while said electrically conductive first chemical solution is continued to be supplied to said back surface of said semiconductor device, and wherein the first chemical solution comprises an electrical conductivity of 1 µS/cm or more.

12. The method of manufacturing a semiconductor device according to claim 1, wherein said performing the wet etching is started after a period of time during which an electrically charged amount of said semiconductor substrate is reduced to a predetermined amount.

13. The method of manufacturing a semiconductor device according to claim 1, wherein the electrical charge of said semiconductor substrate is reduced by supplying of the electrically conductive first chemical solution to the back surface of the semiconductor substrate.

14. The method of manufacturing a semiconductor device according to claim 1, wherein the first chemical solution comprises an electrical conductivity of 5 µS/cm or more.

15. The method of manufacturing a semiconductor device according to claim 1, wherein the first chemical solution comprises buffered hydrofluoric acid.

16. The method of manufacturing a semiconductor device according to claim 1, wherein the first and second chemical solutions comprise buffered hydrofluoric acid,
    wherein a flow rate of the first and second chemical solutions is approximately 2 L/min, and
    wherein a time period between starting to supply the first chemical solution and starting to supply the second chemical solution is set between 5 and 30 seconds.

17. The method of manufacturing a semiconductor device according to claim 1, wherein the electrical charge of said semiconductor substrate is reduced to a predetermined amount.

18. The method of manufacturing a semiconductor device according to claim 1, further comprising:
    before said supplying the electrically conductive first chemical solution to said back surface of said semiconductor substrate:
        forming an element isolation region on said front surface of said semiconductor substrate to form a first diffusion region and a second diffusion region;
        forming a first oxide film on said front surface of said semiconductor substrate; and
    forming a resist pattern on said first oxide film; and
    after said performing wet etching:
        removing said resist layer on said semiconductor substrate; and
        forming a second oxide film on said front surface of said semiconductor substrate,
    wherein in said supplying the electrically conductive first chemical solution to said back surface of said semiconductor substrate, said electrically conductive first chemical solution is supplied to reduce the electrical charge of said semiconductor substrate, and
    wherein in said performing wet etching said electrically conductive second chemical solution is supplied to said front surface of said semiconductor substrate to remove said first oxidation film in said first diffusion region.

19. The method of manufacturing a semiconductor device according to claim 1, wherein in said supplying the electrically conductive first chemical solution, an electrical charge of the semiconductor substrate is reduced by the electrically conductive first chemical solution, and
    wherein said performing the wet etching is started after the electrical charge of said semiconductor substrate is reduced by the electrically conductive first chemical solution.

20. A method of manufacturing a semiconductor device, comprising:
    supplying an electrically conductive first chemical solution to a back surface of a semiconductor substrate, on a front surface of which elements are formed, an electrical charge of the semiconductor substrate being reduced by the electrically conductive first chemical solution; and
    after starting said supplying said electrically conductive first chemical solution to said back surface of said semiconductor substrate, performing wet etching by supplying an electrically conductive second chemical solution to said front surface of said semiconductor substrate,
    wherein said performing the wet etching is started when the electrical charge of said semiconductor substrate is reduced by the electrically conductive first chemical solution, and
    wherein the first chemical solution comprises an electrical conductivity of 1 µS/cm or more.

21. The method of manufacturing a semiconductor device according to claim 1, wherein the first chemical solution comprises an electrical conductivity substantially equal to an electrical conductivity of the second chemical solution.

22. The method of manufacturing a semiconductor device according to claim 1, further comprising measuring the electrical charge of said semiconductor substrate using a capacitance sensor.

* * * * *